United States Patent [19]

Beg et al.

[11] Patent Number: 5,264,802
[45] Date of Patent: Nov. 23, 1993

[54] CIRCUIT AND METHOD FOR MONITORING PHASE ERROR MODULATION

[76] Inventors: Mirza A. Beg, 114 Emerald La., Lima, Ohio 45805; Mark E. Schumacher, 4265 N. Napoleon Rd., Lima, Ohio 45801

[21] Appl. No.: 747,822

[22] Filed: Aug. 21, 1991

[51] Int. Cl.⁵ .......................... H03K 9/06; H03K 5/13
[52] U.S. Cl. .................................. 328/133; 328/155; 307/511; 307/262
[58] Field of Search .......... 328/155, 133, 134; 307/511, 514, 262; 377/47

[56] References Cited

U.S. PATENT DOCUMENTS

| | | | |
|---|---|---|---|
| 4,339,731 | 7/1982 | Adams | 328/134 |
| 4,675,597 | 6/1987 | Hernandez | 324/73 R |
| 4,707,142 | 11/1987 | Baker et al. | 368/46 |
| 4,849,704 | 7/1989 | Thornton | 328/133 |
| 4,870,664 | 9/1989 | Hayashi | 377/44 |
| 4,878,231 | 10/1989 | Cok | 328/133 |
| 4,902,920 | 2/1990 | Wolaver | 328/133 |
| 4,982,109 | 1/1991 | Burwell | 307/265 |

Primary Examiner—Timothy P. Callahan
Attorney, Agent, or Firm—Michael S. Yatsko

[57] ABSTRACT

A circuit is provided for detecting phase error between two signals by producing a phase error signal having a series of pulses wherein the widths of the pulses are representative of the phase error and producing a polarity signal representative of the polarity of the phase error. The phase error signal and polarity signal are used to produce a count representing the magnitude and polarity of the phase error for each of the pulses in the phase error signal. This count is converted to an analog signal which is compared to a pair of reference level signals to produce an output signal representative of the acceptability of the phase error corresponding to each of the pulses in the phase error signal.

13 Claims, 3 Drawing Sheets

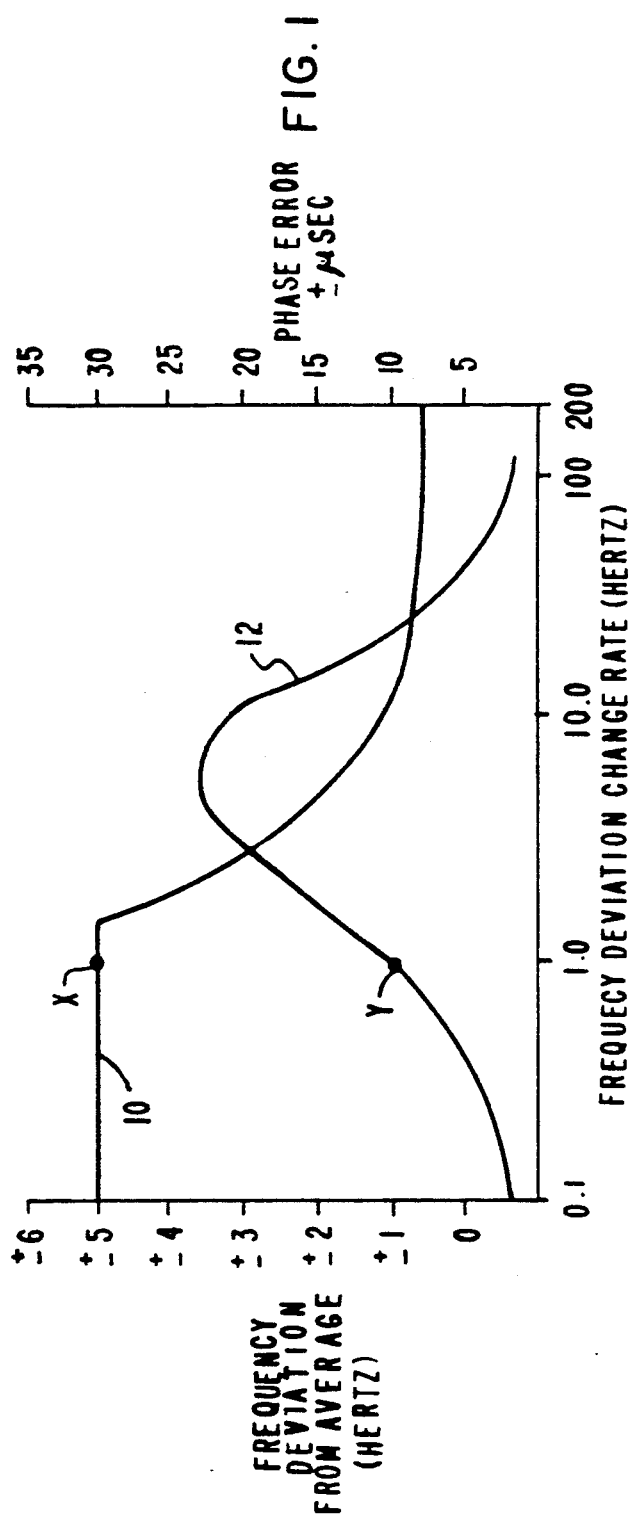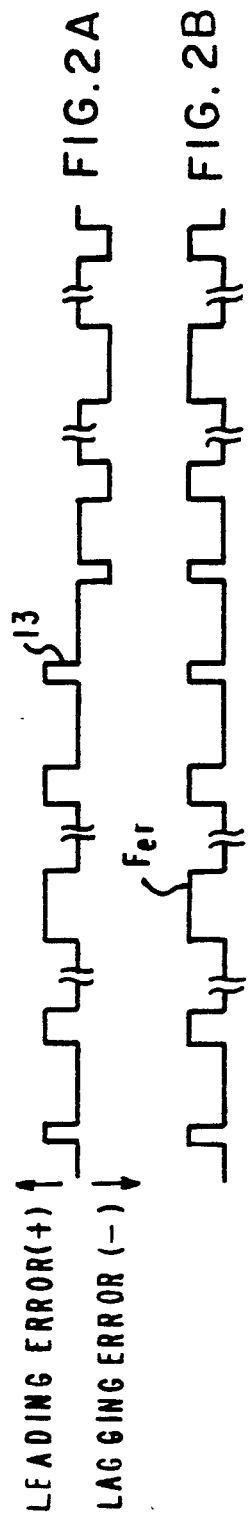

CIRCUIT AND METHOD FOR MONITORING PHASE ERROR MODULATION

BACKGROUND OF THE INVENTION

This invention relates to circuits and methods for monitoring phase error between two signals and, more particularly, to such monitoring in which the phase error between the signals is subject to phase error modulation.

AC electric power systems are usually connected in parallel to increase total system rating or in certain cases such as airborne power systems, to increase reliability. One well known type of aircraft electric power system is the DC link variable speed constant frequency (VSCF) system. Such systems include a plurality of power pole switching elements which synthesize an AC output by switching current from a pair of DC link conductors in a fixed switching pattern, which may be generated by a microprocessor or other digital circuit. When these systems are to be operated in parallel with each other or with another source such as a ground power cart, each of the power sources must be synchronized. Since DC link VSCF systems are clock-based, a master clock signal is used to synchronize each of the system channels.

The clock signal is a common signal used to synchronize each channel. No break power transfer (NBPT) is a special application of a parallel system which allows momentary paralleling with another power source. The other source is typically an auxiliary power unit (APU) or a ground power unit (GPU). For NBPT, the master clock should be able to track the frequency of an external source. During NBPT, there is a transient due to mismatched phase angles and magnitudes of the two system voltages about to be momentarily parallelled. Severe transients and tripping of the VSCF system could result if excessive phase error exists prior to NBPT. To minimize such transients, it is necessary to ensure proper phase angle matching prior to paralleling.

In a typical system, a phase error signal is produced, which contains a pulse train with the phase error indicated by the pulse widths. External power sources often have a frequency modulation specification which permits a certain amount of frequency modulation in the output. VSCF paralleling controls typically have a phase locked loop (PLL). This PLL provides a frequency reference (master clock), which is phase locked with the external power source frequency, to all VSCF channels. The phase error is the phase difference between the external power source frequency and the master clock reference for the VSCF system. If the external power source is subject to frequency modulation, the PLL will be continuously in a state of change, trying to track the external frequency. The phase error will consequently also be in a continuous state of change.

The PLL is a closed loop system and has a transient response associated with it such that any frequency changes in the external power source frequency are reflected in the master clock after a time delay. For example, if the external power source frequency is changed by 10 Hz (from 400 Hz to 410 Hz), the phase error will increase, resulting in a change in the frequency of the master clock and as the master clock frequency reaches the external power source frequency, the phase error will reduce to zero. So on a transient basis, the phase error may exceed the specified static limit for parallelability. Therefore, a check of the average dynamic phase error between the external source and the VSCF system will be required to determine if the systems can be paralleled. This invention detects and extracts the average dynamic phase error, to determine if it is within certain predetermined specifications.

SUMMARY OF THE INVENTION

Circuits constructed in accordance with this invention include components for producing a phase error signal having a series of pulses wherein the pulse widths are representative of a phase error between two signals, such as an external reference signal and a master clock signal. The circuits also produce a polarity signal representative of whether one of the signals is lagging, or leading the other. The phase error signal and polarity signal are used to produce a count which is representative of the magnitude and polarity of the phase error for each of the pulses in the phase error signal. The count is used to produce an analog signal. The analog signal, representing the phase error count, is then averaged and compared to two reference level signals to produce an output signal representative of the acceptability of the phase error modulation between the two signals.

This invention encompasses both phase error monitoring circuits and the method used by those circuits to detect phase error between two signals. In the preferred embodiment, a circuit is disclosed which will translate a phase error signal into an analog signal whose amplitude will be proportional to the phase error between two signals. This analog signal can be averaged and compared against a reference to determine if paralleling of two power sources can be initiated safely.

BRIEF DESCRIPTION OF THE DRAWINGS

The present invention will become more readily apparent to those skilled in the art from the following description of the preferred embodiment thereof, as illustrated in the accompanying drawings, wherein:

FIG. 1 is a plot of a typical frequency modulation specification for the frequency of a typical external power source, and the associated maximum phase error for a typical phase locked loop attempting to keep a phase lock between the input frequency reference and the output of the PLL;

FIG. 2A is a waveform which illustrates the leading-/lagging phase error concept of the invention;

FIG. 2B illustrates a phase error signal produced by the phase detector of the circuit of FIG. 3;

FIG. 2C illustrates the polarity signal produced in the circuit of FIG. 3;

DESCRIPTION OF THE PREFERRED EMBODIMENT

Figure 3:
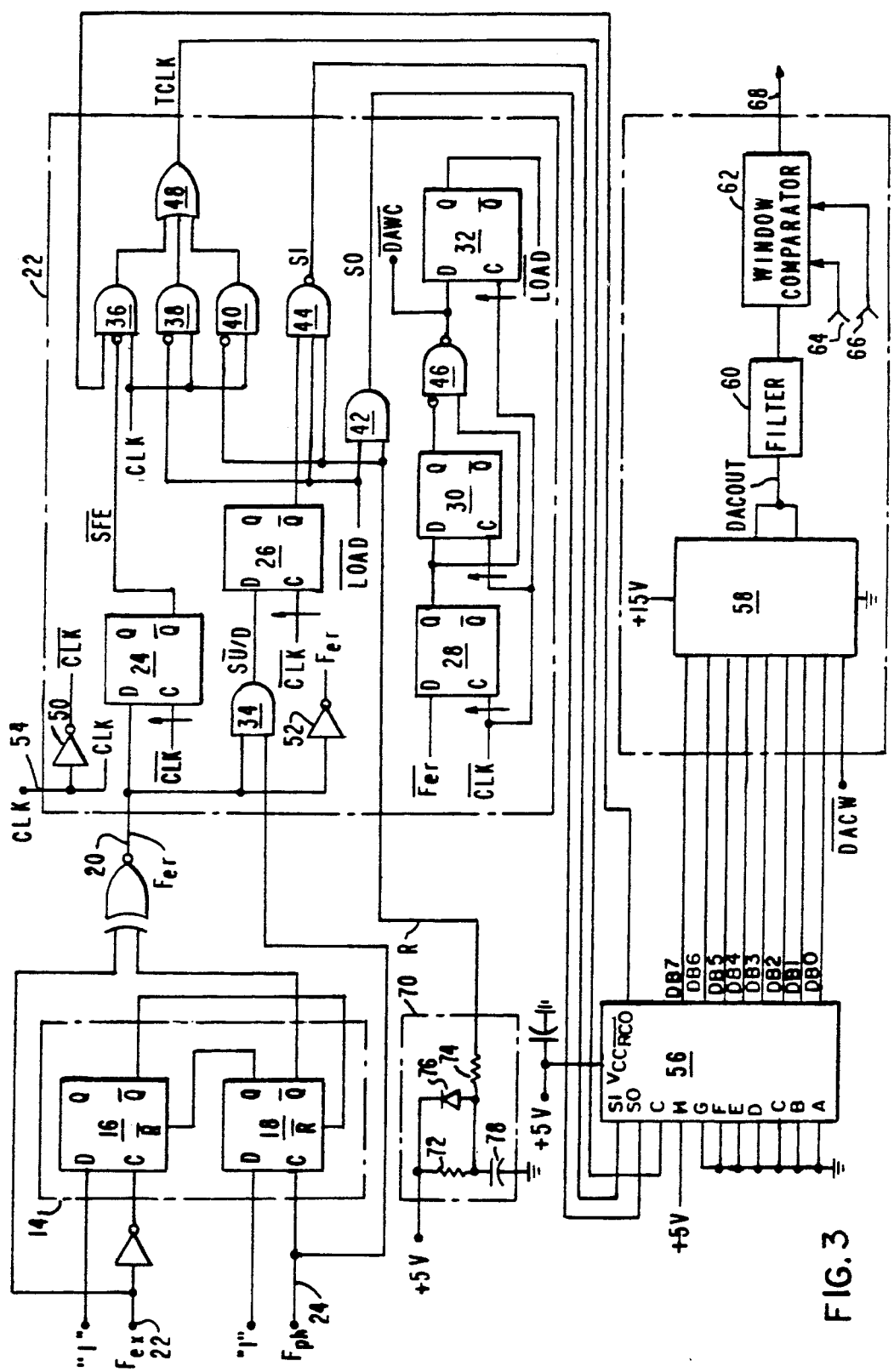
FIG. 3 is a schematic diagram of a circuit constructed in accordance with the preferred embodiment of the present invention.

Typical external power sources are allowed to have some frequency transients or frequency modulation. This allowed frequency modulation will cause a phase error to be produced and the PLL will cause the master clock frequency to match the external power source frequency. Dynamically, the phase error may be greater than the specified static phase error limit, but on the average, the phase error will be zero (because the frequency modulation of the external power source is also zero on the average). So to check the parallelability of the two sources, the phase error must be averaged and compared to the specified limit. As long as the average phase error is within the specified limit, the systems should be allowed to be paralleled.

Referring to the drawings, FIG. 1 is a plot of a typical frequency modulation specification relating the maximum permitted frequency deviation from average in Hertz with respect to the frequency deviation change rate in Hertz (frequency modulation).

Curve 10 of FIG. 1 represents a typical allowed frequency modulation. Consider point X on curve 10. It has a frequency deviation from average of ±5 Hz, and a frequency deviation change rate of 1 Hz. This means that a 400 Hz source is allowed to vary between 395 Hz and 405 Hz. It also specifies that the frequency can change from 395 to 405 Hz at a rate of 1 Hz. So the 400 Hz frequency can change sinusoidally at a rate of 1 Hz from 395 Hz to 405 Hz. Now suppose this signal is applied to a typical VSCF PLL to generate a master clock signal. The PLL will try to match the master clock to the input signal whose frequency is varying. As the input frequency varies from 400 Hz to 405 Hz and then to 395 Hz and back to 400 Hz, the phase error also changes to make the master clock in phase with the input reference signal. For a typical PLL used in VSCF systems, the maximum phase error between an external source (with a frequency modulation shown by curve 10 in FIG. 1) and a VSCF power source is approximately 25 microseconds as illustrated by the phase error curve 12. Since the phase error is dynamic (changing with curve 10), a simple measurement scheme for the static phase error between the external power source and a VSCF system will not be sufficient to determine if the systems can be paralleled.

The waveform 13 of FIG. 2A illustrates the leading-/lagging phase error concept of the invention. The polarity of the pulses in waveform 13 indicates whether the reference signal is leading or lagging the master clock signal. Although waveform 13 does not exist in the preferred embodiment of the invention, it has been included here to show the leading/lagging phase error concept.

The phase error input signal will cause a maximum phase error of ±10 microseconds. This maximum phase error is represented by point Y on curve 12 in FIG. 1, which corresponds to the input frequency reference modulation represented by point X on curve 10. So for each point on curve 10, there will be a corresponding maximum phase error which is represented by a point on curve 12. Curve 12 was obtained experimentally for a typical VSCF PLL for a parallel system.

The phase error changes from zero to maximum value and then to zero as the input frequency changes from 400 Hz to 405 Hz to 400 Hz. Then the phase error changes polarity and goes through the same transition as the input frequency changes from 400 Hz to 395 Hz and back to 400 Hz. From FIG. 1, it can be seen that the maximum phase error could be over ±20 microseconds. The average value of the phase error will be zero. It is therefore clear that a static phase error limit (of ±5 micro second) check for parallelability will not be sufficient. Therefore, a circuit is required which would average the phase error signal over a certain time period. If this average value is not zero, that would suggest the presence of a steady state phase error. If this steady state average value gets over some preselected value, such as ±5 microseconds, that would then represent a condition of non-parallelability.

The circuit of FIG. 3 detects phase error modulation then averages the phase error and compares it against a reference level to produce a signal representing the parallelability condition. A phase detection circuit 14 comprised of a pair of bi-stable circuits, as represented by type D flip-flops 16 and 18, connected as shown, produces an output signal $F_{er}$ (as shown in FIG. 2B) having a series of pulses wherein the widths of the pulses are representative of the phase error between a first pulse train signal $F_{ex}$ supplied on terminal 21 and a second pulse train signal $F_{ph}$ supplied on terminal 24. Signal $F_{ex}$ is a pulse train signal representative of the external power source frequency and signal $F_{ph}$ is a pulse train signal representative of an internal frequency reference (master clock) in a VSCF system. Additional details of the operation of the phase detector 14 can be found in U.S. Pat. No. 4,849,704.

Phase error is represented by a pulse train having a series of pulses wherein the widths of the pulses are proportional to the phase error. It is therefore necessary to average a pulse train having small pulse widths. In a typical VSCF system, the phase errors will be in the 2 to 5 microsecond range. In a 400 Hz system, phase error pulses will occur once per cycle (each 2500 microseconds). This represents a duty cycle of 0.2% for a 5 microsecond phase error. A 0.2% duty cycle in a 5 volt logic signal would be 10 millivolts. Conventional averaging schemes cannot accurately measure these low average values because of component tolerances and offset values.

FIG. 3 represents a unique approach to averaging low duty cycle pulse trains. The phase error signal $F_{er}$ is supplied to a logic array 22 which has been configured into flip-flop circuits 24, 26, 28, 30 and 32; AND circuits 34, 36, 38, 40 and 42; NAND circuits 44 and 46; OR circuit 48; and inverters 50 and 52 connected as shown. A clock signal CLK is supplied to the circuit by way of line 54. Circuit 22 supplies output signals S1, S0, and TCLK to a synchronous up/down counter 56. In this embodiment, a synchronous counter is an eight-bit phase error counter connected as shown to have an initial count set to its mid scale, 80H. The direction in which the counter counts is controlled by signals S1 and S0. Signal TCLK is a clock signal having a series of pulses which are counted by counter 56. The output of counter 56 is supplied to a digital-to-analog converter (DAC) 58. The output of the DAC is filtered by an averaging filter 60 and compared in a window comparator 62 to a pair of reference signals supplied on lines 64 and 66 to produce an output signal on line 68 which is representative of the acceptability of the phase error between the power systems for parallelability. A reset circuit 70 comprising resistors 72 and 74, diode 76 and capacitor 78 provides a power on reset function wherein the error counter 56 is loaded to mid scale (80H) while the reset signal R is low.

The circuit of FIG. 3 provides a 0 to 10 volt analog output (DACOUT) which represents the phase error between pulse signals $F_{ex}$ and $F_{ph}$ for each measurement cycle (each period of the pulse signals). A 5 volt output of digital-to-analog converter 58, i.e., the mid value of the dynamic range of the DAC output, corresponds to 0 phase error.

Figure 4:
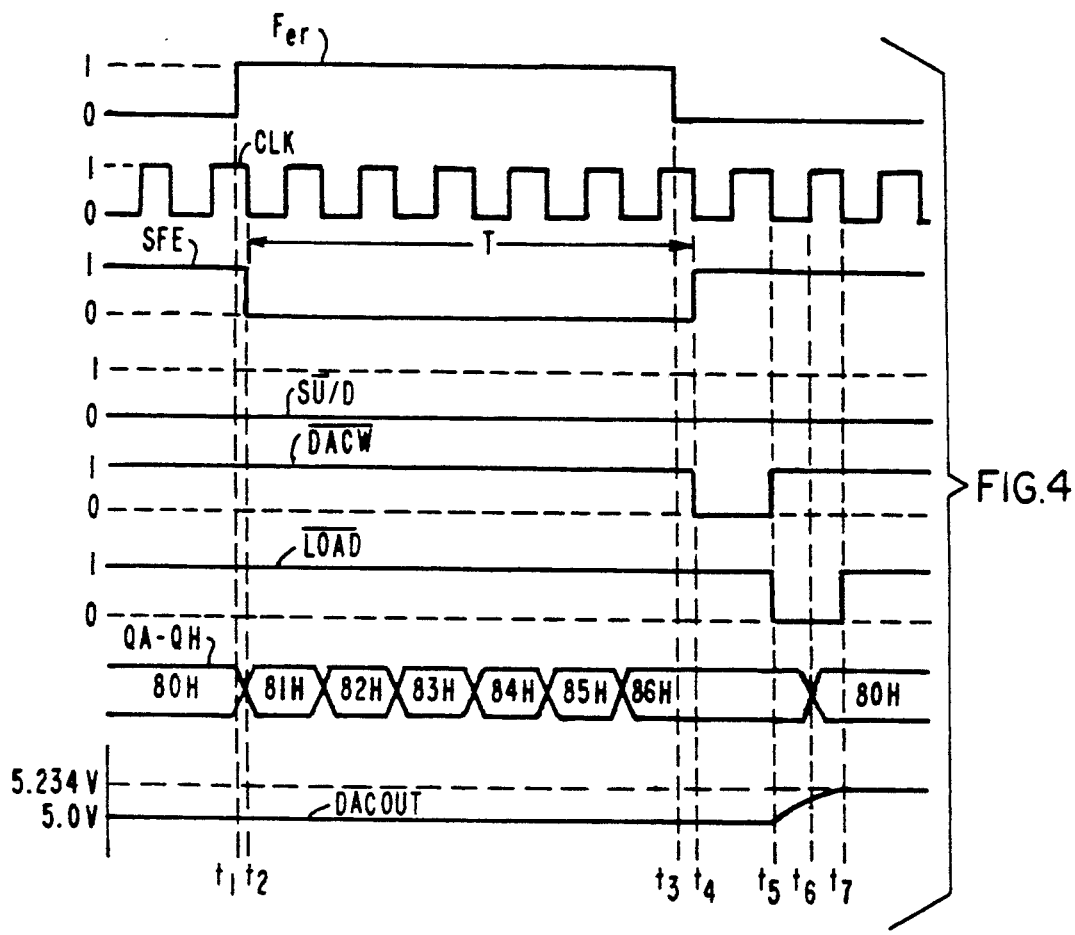
FIG. 4 is a series of waveforms which illustrate the operation of the circuit of FIG. 3.

The operation of the circuit will now be described with reference to the timing diagram of FIG. 4. First, the circuit is initialized by setting the 8-bit phase error counter 56 to its mid scale, 80H. At time $t_1$, a pulse in signal $F_{er}$ (whose width represents the phase error) changes logic levels. At $t_2$, this signal is inverted and synchronized to a falling edge of the clock signal CLK and redesignated $\overline{SFE}$. Transitions of signal $\overline{SFE}$ from high to low mark the beginning of a phase error measurement cycle defined by T in FIG. 4. A polarity signal $S\overline{U}/D$, representing whether $F_{ex}$ leads or lags $F_{ph}$, is produced as shown in FIG. 3. The polarity signal $S\overline{U}/D$ has a low value when $F_{ex}$ leads $F_{ph}$ and a high value when $F_{ex}$ lags $F_{ph}$. The polarity of the phase error specified by signal $F_{er}$ is represented by the logic level of signal $S\overline{U}/D$ as shown in FIG. 2(C). The direction of count of the phase error counter is programmed to count up for $S\overline{U}/D=0$ (increasing analog output) or to count down for $S\overline{U}/D=1$ (decreasing analog output). This is accomplished by control signals S0 and S1. The phase error is digitally quantitized with polarity by clocking the error counter 56 with signal TCLK (the gated clock signal) for the time that signal $\overline{SFE}$ is low. The counter counts up or down from 80H depending on the polarity of $S\overline{U}/D$. Once signal $\overline{SFE}$ is removed, as illustrated by its transition from a low to high logic level at time $t_4$, the clock signal TCLK is gated off and the count value stored in the error counter represents the phase error for this measurement cycle. At this time, the DAC write signal $\overline{DACW}$ is set low for one clock cycle.

The phase error in microseconds is now represented by the count as follows:

*Error Count = t * CLK*

Where: t = phase error (width of $F_{er}$ pulse) in μSec; and CLK = clock frequency in MHz.

Synchronized to the next falling edge of clock signal CLK, signal $\overline{DACW}$ rises, latching the error counter value into the DAC register. Also, at this time, the $\overline{LOAD}$ signal is set low for one clock cycle initiating the counter to its mid value of 80H. After the response time of the digital-to-analog converter, its output DACOUT represents the phase error for this measurement cycle:

*Vout (DAC output) = [5±(5/128) * Error Count] Volts*

On the next rising edge of the clock, at time $t_6$, the error counter is set to mid scale (80H) corresponding to zero phase error in preparation for the next measurement cycle. Synchronized to the next falling edge of clock signal CLK, signal $\overline{LOAD}$ is set high for the next measurement cycle at time $t_7$. The measurement cycle repeats after one period of signals $F_{ex}$ and $F_{ph}$ and the operation of the circuit is repeated.

The circuit of FIG. 3 clamps the error counter count value appropriately to all zeros or all ones if the dynamic range of the error counter, ±128 counts (±39 microseconds at CLK=3.2768 megahertz), is attempted to be exceeded. This is accomplished by use of the counter output $\overline{RCO}$ signal to gate signal TCLK OFF under this condition. While this introduces clipping in the analog output, it prevents counter roll over which cannot be tolerated.

The circuit of FIG. 3 detects and extracts pulse width modulation information from a pulse train signal $F_{er}$ and represents it as an analog signal (DACOUT). A particular application of this circuit is a phase error monitor for use in phase locked loop applications. A phase locked loop is an integral part of a master clock generator which is required to track an external frequency reference for parallel operation of VSCF power systems. Phase error represents the degree of phase lock of the VSCF system and an external power system. This phase error is used to determine if the two sources can be paralleled. The circuit of FIG. 3 converts the phase error in microseconds into an analog signal in volts. The amplitude of this analog signal represents both the magnitude and polarity (leading or lagging) of the phase error.

Figure 5:
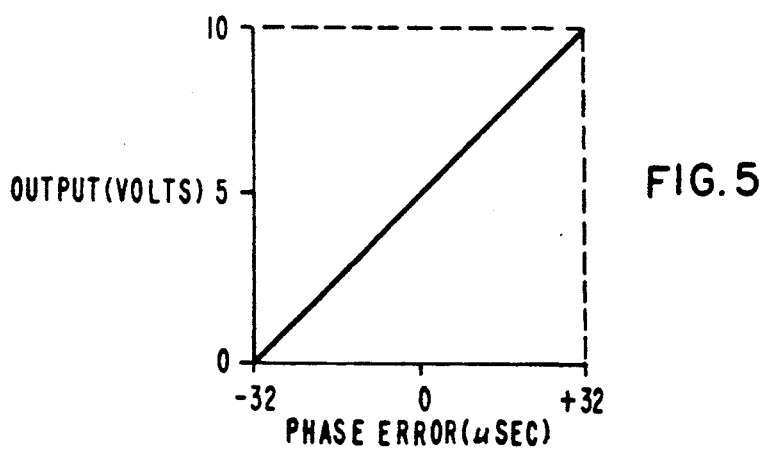
FIG. 5 is a graph of the output voltage of the circuit of FIG. 3.

This invention converts the phase error (represented by the widths of pulses in signal $F_{er}$) into a digital count. The count is converted to an analog voltage level using a digital-to-analog converter. The analog voltage level is held until the next phase error pulse is received, at which time the analog voltage is updated with the new phase error data. FIG. 5 is a graph showing the analog output voltage versus phase error for a CLK frequency of 3.2768 MHz. For a 5 microsecond phase error, the analog output voltage would be 781.25 millivolts. This compares favorably with a 10 millivolt output voltage change for conventional averaging techniques.

Although this invention has been described in terms of its preferred embodiment, it will be apparent to those skilled in the art that various changes may be made without departing from the scope of the invention. It is therefore intended that the appended claims cover such changes.

We claim:

1. A method of detecting phase error between two signals, said method comprising the steps of:

producing a phase error signal having a plurality of pulses wherein the widths of said pulses are representative of a phase error between first and second signals;

producing a polarity signal representative of the polarity of the phase error corresponding to each of said pulses;

producing a plurality of clock pulses;

using said phase error signal and said polarity signal to control a counter which counts said clock pulses to produce a count representative of both the magnitude and polarity of said phase error for each of said pulses in said phase error signal;

producing an intermediate signal representative of said count corresponding to each of said pulses in said phase error signal; and comparing said intermediate signal to first and second reference level signals to produce an output signal representative of whether said phase error corresponding to each of said pulses in said phase error signal is within a predetermined range of values.

2. A method of detecting phase error between two signals, as recited in claim 1, further comprising the step of:

averaging said intermediate signal prior to comparing said intermediate signal to first and second reference level signals.

3. A method of detecting phase error between two signals, as recited in claim 2, wherein said step of using phase error signal and said polarity signal to produce a count includes the step of:

counting said clock pulses for a time corresponding to the width of said pulses in said phase error signal, wherein the direction of counting is controlled by said polarity signal.

4. A method of detecting phase error between two signals, as recited in claim 3, wherein said step of counting said clock pulses is inhibited when said count reaches a predetermined level.

5. A method of detecting phase error between two signals, as recited in claim 3, wherein said step of counting said clock pulses begins at a count value which is substantially a middle value of a preselected count range.

6. A method of detecting phase error between two signals, as recited in claim 1, wherein:
said intermediate signal is an analog signal.

7. A circuit for detecting phase error between two signals, comprising:
means for producing a phase error signal having a plurality of pulses wherein the widths of said pulses are representative of a phase error between first and second signals;
means for producing a polarity signal representative of the polarity of the phase error corresponding to each of said pulses;
means for producing a plurality of clock pulses;
means for using said phase error signal and said polarity signal to control a counter which counts said clock pulses to produce a count representative of both the magnitude and polarity of said phase error for each of said pulses in said phase error signal;
means for producing an intermediate signal representative of said count corresponding to each of said pulses in said phase error signal; and
means for comparing said intermediate signal to first and second reference level signals to produce an output signal representative of whether said phase error corresponding to each of said pulses in said phase error signal is within a predetermined range of values.

8. A circuit for detecting phase error between two signals, as recited in claim 7, further comprising:
means for averaging said intermediate signal prior to comparing said intermediate signal to first and second reference level signals.

9. Circuit for detecting phase error between two signals, as recited in claim 8, wherein said means for averaging said intermediate signal prior to comparing said intermediate signal to first and second reference level signals comprises:
an averaging filter.

10. A circuit for detecting phase error between two signals, as recited in claim 7, further comprising:
means for resetting said counter following the production of said count for each of said pulses in said phase error signal.

11. A circuit for detecting phase error between two signals, as recited in claim 7, further comprising:
means for installing an initial count in said counter, said initial count being one half of a maximum count of said counter.

12. A circuit for detecting phase error between two signals, as recited in claim 7, further comprising:
means for inhibiting said counter when said counter reaches a predetermined count.

13. A circuit for detecting phase error between two signals, as recited in claim 7, wherein:
said means for producing an intermediate signal representative of said count corresponding to each of said pulses in said phase error signal comprises a digital to analog converter for converting said count to an analog signal; and
a filter for filtering said analog signal.

* * * * *